US007032708B2

(12) United States Patent
Popken et al.

(10) Patent No.: US 7,032,708 B2
(45) Date of Patent: Apr. 25, 2006

(54) FLUSH MOUNTABLE VIBRATION REDUCING LOUDSPEAKER MOUNTING ASSEMBLY

(75) Inventors: Ian Popken, Newburyport, MA (US); Allen Boothroyd, Cambridge (GB); Melanie Martindale, Lancashire (GB)

(73) Assignee: Russound/FMP, Inc., Newmarket, NH (US)

( * ) Notice: Subject to any disclaimer, the term of this patent is extended or adjusted under 35 U.S.C. 154(b) by 383 days.

(21) Appl. No.: 10/649,368

(22) Filed: Aug. 27, 2003

(65) Prior Publication Data

US 2005/0045415 A1 Mar. 3, 2005

(51) Int. Cl.
*H05K 5/03* (2006.01)
*H04R 1/02* (2006.01)
*F16F 15/02* (2006.01)

(52) U.S. Cl. ...................... 181/150; 181/209; 381/386; 381/392

(58) Field of Classification Search ................ 181/150, 181/151, 207, 209, 148, 199
See application file for complete search history.

(56) References Cited

U.S. PATENT DOCUMENTS 2,455,861 A * 12/1948 Flanagan .................... 267/141
3,128,999 A * 4/1964 Schmitt ...................... 267/153
3,407,454 A * 10/1968 Myatt ......................... 411/549
3,849,839 A * 11/1974 Zimber ........................ 24/109
4,066,058 A * 1/1978 Anderkay ............... 123/198 E
4,289,929 A * 9/1981 Hathaway ................... 381/351
4,522,378 A * 6/1985 Nelson .................... 267/141.4
5,110,081 A * 5/1992 Lang, Jr. .................... 248/635
5,361,925 A * 11/1994 Wecke et al. ............... 220/325
5,726,395 A * 3/1998 Anagnos ..................... 181/141
6,354,578 B1 * 3/2002 Nakatsukasa et al. ....... 267/258
6,415,036 B1 * 7/2002 Ritter et al. ................ 381/388
6,454,250 B1 * 9/2002 Ribeiro ....................... 267/141
6,550,570 B1 * 4/2003 Combest ..................... 181/150
6,744,903 B1 * 6/2004 Jeon ........................... 381/388
2003/0016493 A1 * 1/2003 Hiratomo et al. ........... 361/685
2004/0084243 A1 * 5/2004 Decanio et al. ............. 181/150

FOREIGN PATENT DOCUMENTS

JP 59219098 A * 12/1984

OTHER PUBLICATIONS

Infinity CAS 3.1 and CAS 2.1 Owner's Guide; 2001 Infinity Systems, Inc.
Infinity, A Technical White Paper on the CAS In-Wall Loudspeakers; Prior to Aug. 2003.

* cited by examiner

*Primary Examiner*—Edgardo San Martin
(74) *Attorney, Agent, or Firm*—Weingarten, Schurgin, Gagnebin & Lebovici LLP

(57) ABSTRACT

A vibration dampening speaker mounting assembly includes a flush-mountable frame for mounting to a wall or ceiling, at least one vibration dampening member, and a baffle for supporting a single or multi-driver transducer array. The at least one vibration dampening member is disposed between the baffle and the frame to reduce acoustic distortions coupled to the wall/ceiling from the baffle. Fasteners are provided that permit installation of the baffle to the frame without tools while avoiding significant acoustic coupling between the baffle and the frame through the fasteners.

10 Claims, 4 Drawing Sheets

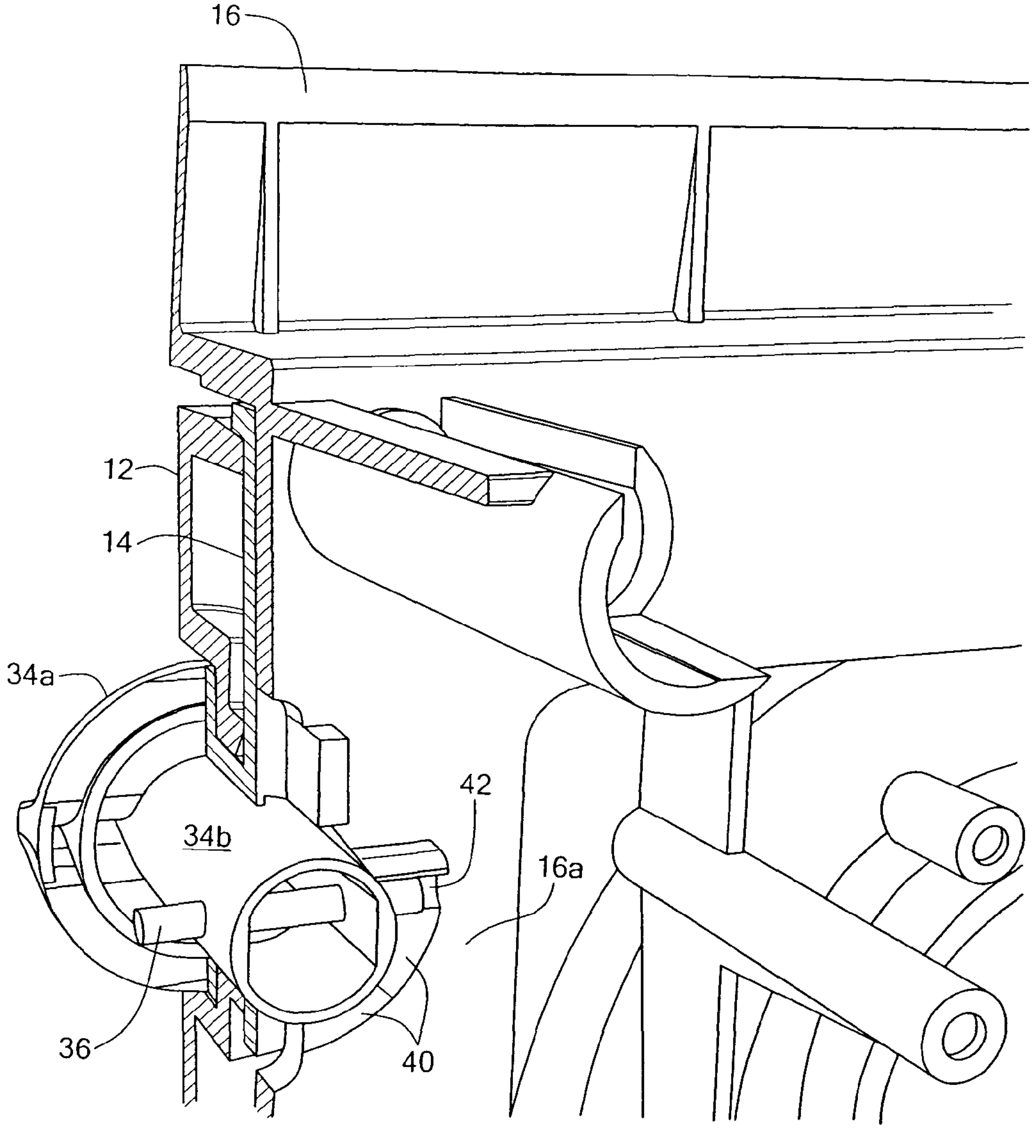
FIG. 4
FIG. 5
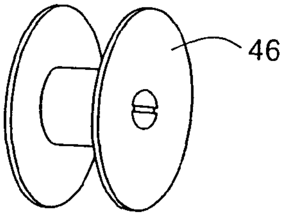

FLUSH MOUNTABLE VIBRATION REDUCING LOUDSPEAKER MOUNTING ASSEMBLY

CROSS REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

The present invention relates to techniques for mounting speakers and more specifically to a vibration reducing assembly that is flush mountable within a wall or ceiling.

The architectural or custom installed loudspeaker industry continues to gain popularity each year. The shortcomings of the standard recessed, flush-mount loudspeaker product have likewise become more generally known. More specifically, sound quality is often far from ideal due to physical limitations regarding the standard gypsum-based wall/ceiling board material to which custom loudspeaker assemblies are most commonly installed. Problems arise when vibration from the installed speaker is coupled to the wall/ceiling to which the speaker mounting assembly is mounted. The wall/ceiling, excited by the loudspeaker's vibration, begins to vibrate and emit unwanted acoustic information. This acoustic information is essentially a distortion of the original signal, degrading the originally intended output signal. Generally speaking, a limiting factor to accurate sound reproduction of a custom installed loudspeaker system is the vibration induced acoustic output of the material in which the loudspeaker system is installed. One approach to reducing wall/ceiling vibration is by means of decoupling the vibration producing elements of the loudspeaker system from the wall/ceiling material in which they become installed.

Ease of installation has and continues to be a significant topic in the industry since custom installation costs are directly related to the amount of time it takes an installer to complete the mounting of the loudspeaker system. Since more and more homes and commercial establishments are seeking the space saving and aesthetic improvements offered through custom installed loudspeaker systems, the ease of installation, the cost reductions associated therewith and the reduction in the risk of damage to the speaker system and the wall/ceiling mounting area during the final installation of the loudspeaker are important factors within the industry.

Previous attempts have been made to provide decoupled, suspended, or damped loudspeaker assemblies where unwanted vibration is either absorbed or the transmission of this vibration is in some way reduced, and a number of patents describe methods of absorbing unwanted vibration, reducing the transmission of unwanted vibration, or canceling vibration energies. Other patents describe methods for simplifying the installation of loudspeaker assemblies in walls/ceilings using various fastening methods that do not require tools or special equipment.

None of the loudspeaker mounting systems known in the art describe a loudspeaker assembly in which a simple means for securing the loudspeaker mounting assembly to the wall/ceiling that does not require the use of tools also provides the means of decoupling vibrations to the wall/ceiling surrounding the loudspeaker mounting assembly. It would therefore be desirable to have a loudspeaker mounting assembly that could be readily mounted within a wall/ceiling without the use of tools and which also effectively decouples vibrations to the surrounding wall/ceiling so as to reduce distortion of the acoustic signals.

BRIEF SUMMARY OF THE INVENTION

In accordance with the present invention, a vibration dampening loudspeaker assembly is disclosed that is easily mountable within a wall or ceiling. The assembly includes a frame that is mountable to the wall/ceiling, a baffle and at least one vibration dampening member, such as a vibration dampening gasket that is disposed between the baffle and the frame when the assembly is fully assembled. The vibration dampening member serves to suspend the baffle and the vibrating loudspeakers affixed thereto from the frame portion that is in contact with the wall/ceiling and acoustically isolates the baffle from the frame to reduce acoustic distortion.

The baffle, the vibration dampening member(s) and speakers are assembled as a baffle sub-assembly. Quarter turn fastener(s) are used by an installer to attach the baffle sub-assembly to the installation frame that is mounted in the wall/ceiling. The quarter turn fasteners only contact one of the baffle or the frame and the vibration dampening member so as to reduce coupling of vibration from the baffle to the frame via the fasteners. In the illustrated embodiment, the fasteners can be used to quickly and securely attach the baffle to the frame without the use of tools. By eliminating the need for tools during the final installation of the baffle to the frame, the opportunity for damage to the loudspeaker or end user homes is significantly reduced.

Other aspects, features and advantages of the invention will be apparent from the Detailed Description of the Invention that follows.

BRIEF DESCRIPTION OF THE SEVERAL VIEWS OF THE DRAWINGS

The invention will be more fully understood by reference to the following Detailed Description of the Invention in conjunction with the Drawing of which:

FIG. 4 is a perspective partial cut-away view of an assembled speaker mounting system depicting the fastener in its seated position within the assembly; and FIG. 5 is an alternative vibration dampening member for use in the speaker mounting assembly.

DETAILED DESCRIPTION OF THE INVENTION

In accordance with the present invention an improved mounting assembly for at least one loudspeaker is disclosed. The mounting assembly provides for rapid installation of a speaker baffle to a frame that is mountable to a wall or ceiling. The installation of the baffle to the frame is accomplished without tools via fasteners. A vibration dampening member is disposed between the baffle and the frame to reduce undesired acoustic distortion.

Figure 1:
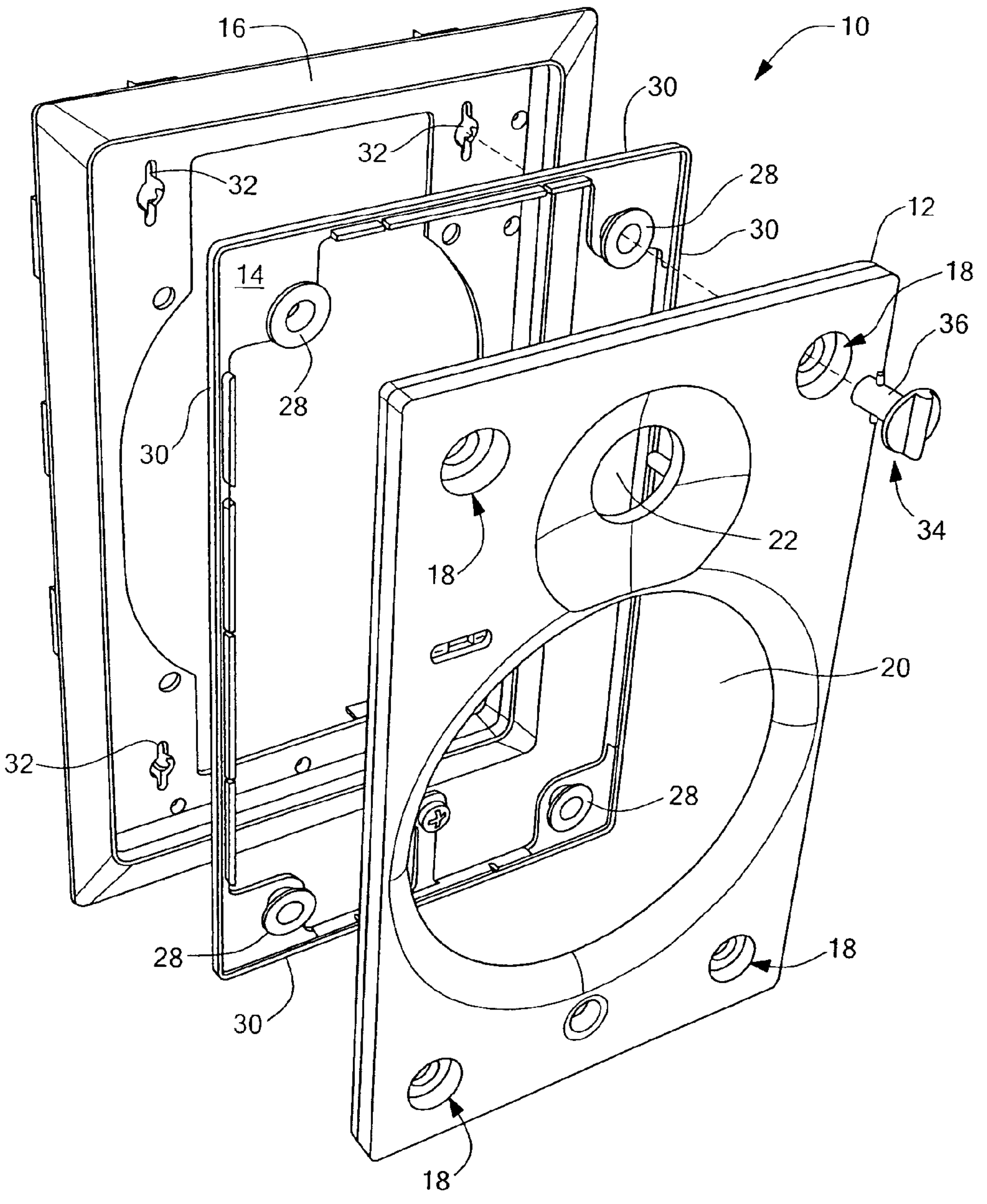
FIG. 1 is a first exploded perspective view of a speaker mounting assembly in accordance with the present invention.
Figure 2:
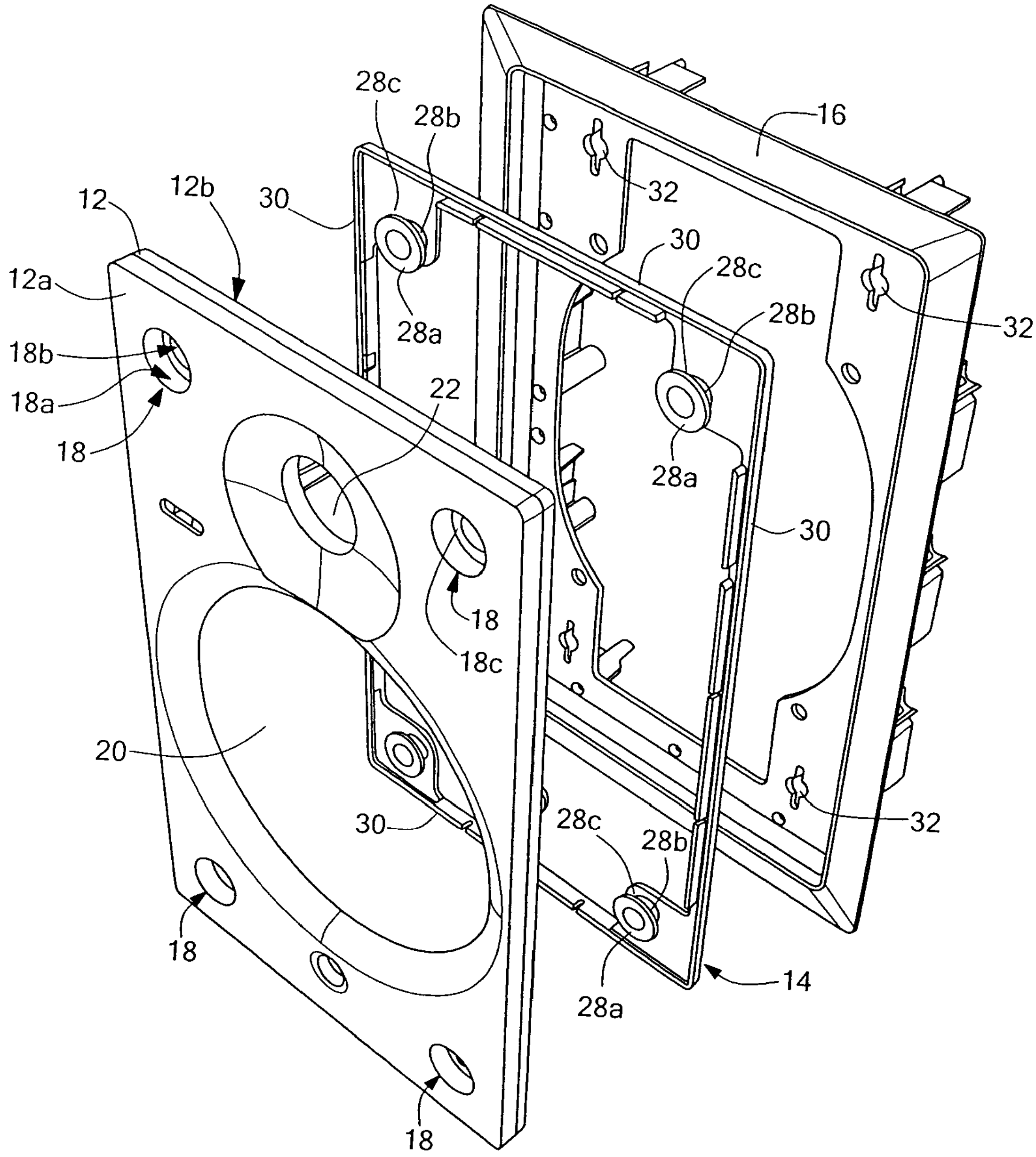
FIG. 2 is a second exploded perspective view of the speaker mounting assembly of FIG. 1.
Figure 3:
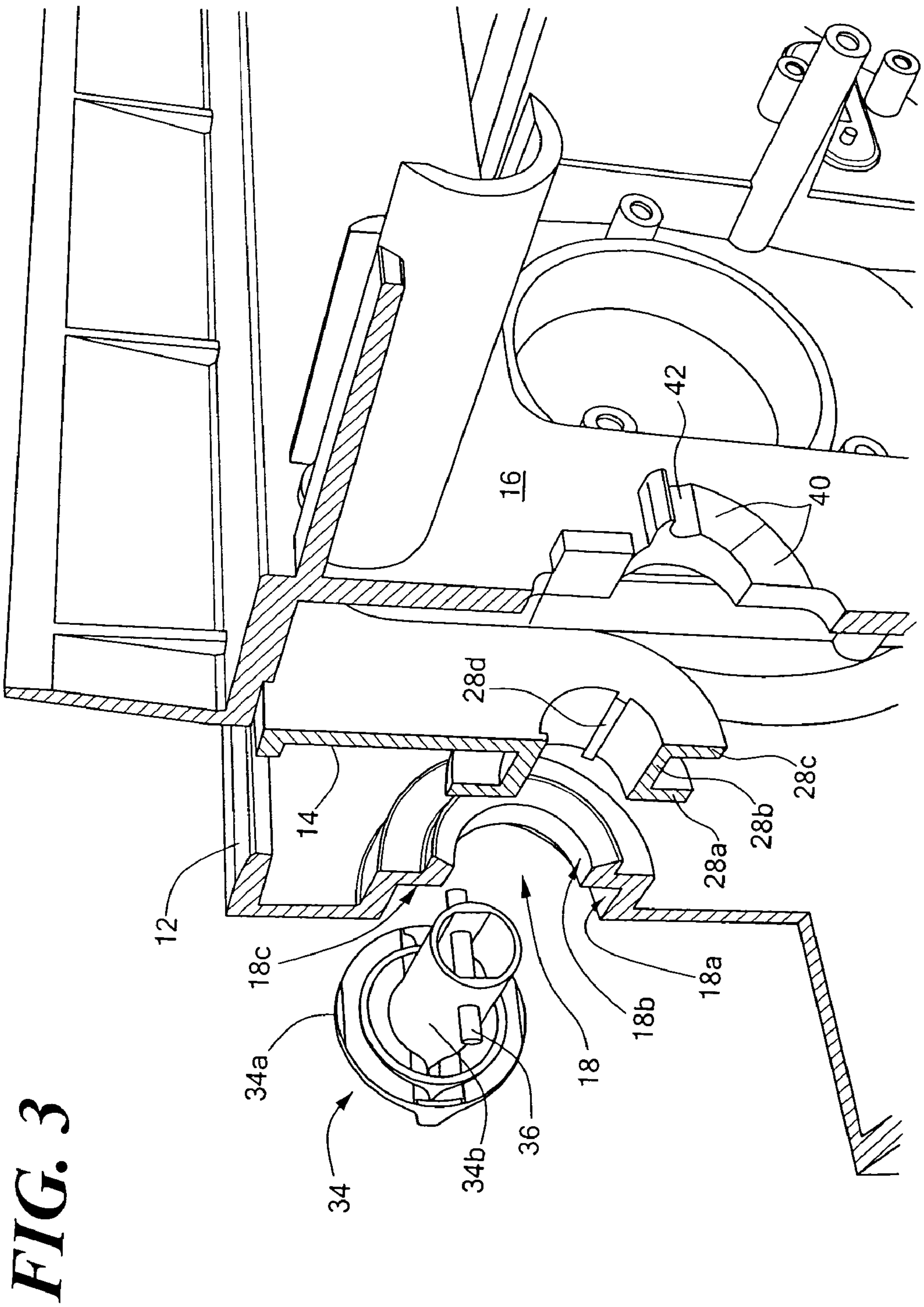
FIG. 3 is a perspective exploded partial cut-a-way view of a fastener used in the mounting assembly of FIG. 1.

Referring to FIGS. 1–4, the mounting assembly 10 includes a baffle 12, at least one vibration dampening member 14, such as a vibration dampening gasket or insert, a frame member 16 and fasteners 34. The baffle 12 includes a front surface 12*a* that faces the interior of the room when the assembly is installed and a rear surface 12*b* on the opposing side of the baffle 12.

Stepped openings 18 are provided in respective corners of the baffle 12. The openings 18 have a larger diameter generally circular recess 18*a* adjacent the front surface 12*a* of the baffle 12 and a smaller diameter opening 18*b* adjacent the rear surface 12*b* of the baffle 12. The recess 18*a* and the opening 18*b* are generally coaxially aligned and define a shoulder 18*c* at the bottom of the recess 18*a*. The baffle 12 also includes openings 20 and 22. A low frequency driver (not shown) is mountable to the baffle 12 behind the opening 20 and a high frequency driver (not shown) is mountable to the baffle 12 behind the opening 22. The openings 20 and 22 permit the projection of sound through the openings and into the intended listening area.

The frame 16 is mountable to a wall/ceiling via any technique known in the art. Typically, a cutout is made in the wall/ceiling and the frame 16 is mounted to the respective surface via the use of swing out clamps that engage the back surface of the wall/ceiling via fasteners or any other suitable technique for mounting the frame 16 to the mounting surface.

The vibration dampening member in the first illustrated embodiment comprises a vibration dampening gasket 14 that is integrally formed of a thermo plastic rubber (TPR) suitable for providing dampening of anacoustic signal. A TPR of 20–30 durometer may be employed although it should be recognized that any suitable material that serves to provide the desired vibration dampening may be substituted for the TPR. The vibration dampening gasket 14 includes a plurality of grommet-like projections 28 that are integrally formed with the vibration dampening gasket 14. The projections 28 include a forward lip 28*a*, a cylindrical portion 28*b* having an outer diameter that is smaller than the outer diamter of the lip 28*a*, and a rear portion 28*c* which is an integral part of the vibration dampening gasket 14. An opening extends through each projection 28. The projections 28 further include ridges 28*d* aligned axially within the openings through the projections on the opening surface. The ridges 28*d* serve to center the fastener 34 within the opening when the fastener is inserted through the projection 28. The openings through the projections 28 are located so as to coaxially align with the openings 18 of the baffle 12. Additionally, an integrally formed flange 30 is provided around the peripheral edge of the vibration dampening gasket 14 to form a generally airtight seal between the frame 16 and the baffle 12 when the baffle 12 is mounted to the frame 16 with the vibration dampening gasket 14 mounted therebetween.

Keyhole slots 32 are provided in respective corners of the frame 16. The keyhole slots 32 are oriented so as to coaxially align with the openings through the projections 28 of the vibration dampening gasket 14 and the openings 18 of the baffle 12 when the speaker mounting assembly 10 is fully assembled.

The fasteners 34 are employed to fasten the baffle 12 to the frame 16 and are cooperative with the projections 28 of the vibration dampening gasket 14 to acoustically isolate the baffle 12 from the frame 16. More specifically, the vibration dampening gasket 14 is first mounted to the baffle 12 by forcing the forward lips 28*a* of the projections 28 through the openings 18*b* from the rear surface 12*b* of the baffle 12. The forward lips 28*a* of the projections 28 have a greater diameter than the diameter of the opening 18*b* through the baffle and the vibration dampening gasket 14 is thereby secured to the baffle 12 after urging the lips of the projections 28 through the openings 18 of the baffle 12 with the rear surface of the forward lips 28*a* abutting the shoulder 18*c* within the opening 18. The rear portion 28*c* of the projection 28 abuts the rear portion 12*b* of th baffle.

After securing the vibration dampening gasket 14 to the baffle 12 a fastener 34 is inserted into each of the openings 18 of the baffle 12 and through the openings of the respective projections 28. The fastener includes a knob portion 34*a* and a shaft portion 34*b*. An opening 34*c* is provided through the shaft portion 34*b* that is sized to receive a roll pin 36 via an interference fit. The shaft portion 34*b* of the fastener is inserted into the opening 18 and through the projection 28 prior to installation of the roll pin 36 within the shaft portion 34*b* of the fastener 34. After the fasteners 34 are inserted through the projections 28 the roll pins 36 are inserted through openings in the shaft portion of the respective fasteners 34. The speakers may then be mounted to the rear surface of the baffle 12 via any conventional mounting technique. The baffle, vibration dampening gasket 14, speakers, and fasteners 34 are assembled as a sub-assembly which may then easily be installed within the frame 16 that has previously been mounted in a wall/ceiling.

In a typical installation, the frame 16 is mounted to a wall or ceiling via swing out clamps that engage the rear surface of the wall or ceiling to which the frame is mounted or via any other suitable mounting technique.

Ramps 40 are integrally formed with the frame 16 on the rear surface 16*a* thereof and are located around the center of the keyhole slots 32. Detents 42 are also formed around the keyhole slots 32 and are integrally formed with the frame 16. The ramps 40 and detents 42 are oriented such that when the shaft portion 34*b* and the roll pin 36 are inserted through the keyhole slot 32 and the knob portion 34*a* of the fastener 34 is rotated, the roll pin 36 rides on the cooperative ramps 40 and slides in to respective detents 42 to secure the baffle 12 to the frame 16 while slightly compressing the vibration dampening gasket therebetween. Preferably, opposing ends of the roll pin 36 slide on ramps and engage opposing detents 42. When so installed, the flange 30 of the vibration dampening gasket 14 forms a air seal between the baffle 12 and the frame 16.

It should be noted that when the fasteners 34 are secured, in the illustrated embodiment, they make direct contact only with the rear surface 16*a* of the frame 16 and the forward lip 28*a* of the projection 28 and therefore do not couple significant acoustic vibrations from the baffle 12 to the frame 16 and the supporting wall or ceiling.

While in the illustrated embodiment, the fasteners 34 directly contact the rear surface 16*a* of the frame 16 and the projection 28 in the form of a portion of the vibration dampening gasket or a grommet, the mounting assembly may alternatively be constructed with the vibration dampening gasket secured to the frame 16 and with the fasteners 34 directly contacting the baffle 12 and the rear surface of the vibration dampening gasket 28.

Additionally, in another embodiment of the invention, rather than providing an integrally formed vibration dampening gasket 14 as shown in FIGS. 1–4, as depicted in FIG. 5, individual grommets 46 may be fabricated of TPR or any other suitable acoustic signal dampening material and installed within the openings 18 of the baffle or alternatively within openings provided in the frame (not shown), as discussed above. In such an embodiment, vibration dampening is improved although dampening provided in this manner is not as effective as the above-described system employing an integrally formed vibration dampening gasket 14 that forms an acoustic dampening seal between the baffle 12 and the frame 16.

It will be appreciated that modifications of and variations to the above-described vibration dampening speaker mounting assembly may be made without departing from the invention concepts disclosed herein. Accordingly, the invention should not be viewed as limited except by the scope and spirit of the appended claims.

What is claimed is:

1. A speaker mounting assembly for mounting within a wall opening, said speaker mounting assembly comprising:

a frame member having a front surface, a rear surface and a first plurality of openings extending through said frame member from said front surface to said rear surface, said frame member configured for mounting within said wall opening;

a baffle member securable to said frame member, said baffle member having a second plurality of openings, said second plurality of openings of said baffle member being oriented to coaxially align with said first plurality of openings of said frame member when said baffle member is secured to said frame member, said baffle member including at least one speaker opening extending through the baffle, said baffle member having a rear surface facing the interior of said wall opening when said speaking mounting assembly is disposed in a mounting position within said wall opening, said baffle rear surface including mounts for mounting at least one speaker to said baffle rear surface;

a plurality of elastomeric vibration dampening members formed of an acoustic dampening material, said plurality of vibration dampening members secured within one of said first and second plurality of openings, said vibration dampening members having an opening extending therethrough; and a plurality of fasteners for securing said baffle member to said frame member, said plurality of fasteners extending through said openings in said vibration dampening members and said frame member, each of said plurality of fasteners including a head portion having a shoulder that abuts a corresponding vibration dampening member and a locking member at the distal end of the respective fastener from said head portion, said locking member operative to engage said frame member upon rotation of the fastener to a locking position to captively secure said baffle to said frame member, said fasteners disposed in non-contacting relation with said baffle member.

2. The speaker mounting assembly of claim 1 wherein each one of said plurality of vibration dampening members is generally grommet shaped.

3. The speaker mounting assembly of claim 1 further including an integrally formed vibration dampening gasket, wherein said vibration dampening members are integrally formed portions of said vibration dampening gasket.

4. The speaker mounting assembly of claim 3 wherein said vibration dampening gasket comprises a thermo plastic rubber.

5. The speaker mounting assembly of claim 4 wherein said vibration dampening gasket is between 20 and 30 durometer.

6. The speaker mounting assembly of claim 1 wherein said baffle has a front surface intended to face into the intended listening area of a room and a rear surface opposing said front surface, and said plurality of openings in said baffle comprise stepped openings, said stepped openings having a first portion of a first diameter adjacent said front surface of said baffle and a second portion of a second diameter adjacent the rear surface of said baffle wherein said first diameter is greater than said second diameter, said openings including a shoulder where said first portion meets said second portion.

7. The speaker mounting assembly of claim 6 wherein said vibration dampening members have a front lip, a rear portion and a central portion joining said front lip and said rear portion, and wherein said vibration dampening members are disposed in said plurality of openings of said baffle with the front lip of said vibration dampening member abutting said shoulder and the rear portion abutting said rear surface of said baffle.

8. The speaker mounting assembly of claim 6 further including:

at least one ramp and at least one detent formed in said rear surface of said frame and adjacent each of said first plurality of openings, said head portion of each of said fasteners including a gripping portion that is grippable by a user to permit manual rotation of the respective fastener from a first position to a second locking position, each of said fasteners including a shaft portion extending from said head portion to the corresponding locking member disposed at the distal end of the fastener from said head portion, each of said locking members extending from the corresponding shaft portion;

said shaft portion of each of said fasteners disposed in and extending through respective openings of said vibration dampening members, said fasteners being rotatable within respective openings of said vibration dampening members such that each respective locking member slides on the corresponding ramp in response to rotation of the fastener and engages the respective detent to secure said baffle to said frame.

9. The speaker mounting assembly of claim 1 wherein each vibration dampening member has an interior surface defining the opening through the respective member and each member further includes a plurality of ridges extending from the interior surface and generally along the length of the opening to center a fastener extending through the respective vibration dampening member opening.

10. The speaker mounting assembly of claim 1 further including at least one loudspeaker mounted to said baffle.

* * * * *